US007026884B2

(12) United States Patent
Vogel

(10) Patent No.: US 7,026,884 B2
(45) Date of Patent: Apr. 11, 2006

(54) HIGH FREQUENCY COMPONENT

(75) Inventor: Ryszard Vogel, Tomtebogatan (SE)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/329,751

(22) Filed: Dec. 27, 2002

(65) Prior Publication Data
US 2004/0124946 A1 Jul. 1, 2004

(51) Int. Cl.
*H01P 5/10* (2006.01)
(52) U.S. Cl. ............... 333/116; 333/24 R; 333/109
(58) Field of Classification Search ............... 333/116, 333/109, 24 R, 114, 113, 115, 110, 112; H01P 5/00
See application file for complete search history.

(56) References Cited

U.S. PATENT DOCUMENTS

| 3,012,210 A | * | 12/1961 | Nigg | ............... | 333/116 |
| 4,216,446 A | | 8/1980 | Iwer | ............... | 333/112 |
| 6,611,181 B1 | * | 8/2003 | Marketkar et al. | ........ | 333/24 R |

FOREIGN PATENT DOCUMENTS

WO WO 02/069440 9/2002

OTHER PUBLICATIONS

"Microstrip Realisation of Loosely Coupled Conductors with Enhanced Directivity"; S.R. Mercer; Electronics Letters 16th; vol. 31, No. 4, pp. 295-296 (Feb. 1995).

"Novel Stripline Coupler for Multilayer Ceramic Integrated Circuit (MCIC) Applications"; Sarmad Al-Taei et al.; Microwave Symposium Digest, 2001 IEEE MTT-S International, vol. 1, pp. 51-54 (May 20-25, 2001).

"A Study of Microstrip Coupler with High Directivity", Jin Lin, 1998 IEEE, pp. 905-908.

"Microstrip Realisation of Loosely Coupled Conductors with Enhanced Directivity", S.R. Mercer, Electronics Letters Feb. 16, 1995, vol. 31, No. 4, pp. 295-296.

"Microstrip Directional Couplers with Ideal Performance Via Single-Element Compensation", Michael Dydyk, IEEE Transactions on Microwave Theory and Techniques, vol. 47, No. 6, Jun. 1999.

* cited by examiner

*Primary Examiner*—Dean Takaoka
(74) *Attorney, Agent, or Firm*—Squire, Sanders & Dempsey LLP

(57) ABSTRACT

The invention relates to a high frequency component of layered structure, and a method for manufacturing the component. The component comprises at least one dielectric layer parallel to the layers of the layered structure, at least two transmission lines for transmitting electrical signals, at least one capacitor, each of which is formed by overlapping parts of two transmission lines, the overlapping parts being for forming capacitive interaction between the parts, and the overlapping parts being arranged to overlap each other in a transversal direction to a dielectric layer parallel to the layers of the layered structure, the dielectric layer being in between the overlapping parts.

2 Claims, 4 Drawing Sheets

HIGH FREQUENCY COMPONENT

FIELD

The invention relates to a high frequency component of layered structure and a method for manufacturing a high frequency component.

BACKGROUND

High frequency components are used in various electronic applications operating in high frequency ranges, especially in the radio frequency range (RF) (3 kHz–300 MHz) or microwave frequency range (300 MHz–30 GHz). In practice the term high frequency is typically used for frequencies higher than 3 MHz. Besides discrete components high frequency components may be parts of integrated electronic circuits. Electronic circuits typically comprise integrated circuits and active and passive components connected to the circuits. Integrated RF and microwave circuits can be divided into hybrid circuits and monolithic microwave circuits (MMIC), which can both be used to manufacture layered structures comprising conductors and components in several layers. High frequency components themselves can also comprise other components such as resistors, amplifiers or capacitors, typically implemented as discrete components.

Nowadays multilayered printed boards with ten or more layers can be manufactured. An advantage of layered structures is the increased routing space and new possibilities of designing or minimizing the devices. In multilayered printed boards the possibility of high coupling between the transmission lines is a feature often seen as a disadvantage. However, in some implementations, such as directional couplers, coupling can be exploited. A disadvantage with layered structures made of different dielectric materials with different dielectric constants, whereby the transmission lines are placed on a surface of the printed board, is the degraded directivity caused by differences in the propagation mode velocities due to non-homogeneity of the dielectric media.

A directional coupler is an example of a high frequency component used in RF and microwave applications for various purposes, such as power monitoring or sampling or power division. Directional couplers can be implemented using coupled lines, typically microstrips, which are coupled together to form a microstrip directional coupler. A problem with the microstrip directional couplers is that directivity is poor, and it decreases with frequency. Eventually the directivity can become negative, resulting to a situation where the signal in the port, which was meant to be isolated can become stronger than the signal in the coupled port of the directional coupler. Besides potential non-homogeneities of the structure, this is derived from the basic structure of a microstrip configuration with a single ground plane only on one side, and the unequal velocities of the propagation modes in microstrip coupled lines.

In prior art, discrete capacitors have been used to improve the directivity. However, the solution suffers from high tolerances caused by a large spread of capacitance values when several separate capacitors are used. The use of separate capacitor components also increases the manufacturing costs, makes the manufacturing more complicated and decreases the reliability of the component because of the needed soldered joints, for example.

In prior art, interdigital or gap capacitors have also been introduced to be used for improving the directivity of a directional coupler. The interdigital capacitor solution is based on capacitors formed by arranging two or four fingers of two coupled lines side by side and crosswise to the direction of the coupled lines. The gap capacitors are based on series of gaps in a microstrip conductor between two coupled lines. However, a problem with these solutions is the limited value of achievable capacitance, even when substrate materials with high dielectric permittivity, i.e. high values of dielectric constants, are used.

In prior art, there are theories for compensating the velocity of even and odd propagation modes in broadside coupled stripline structures, for very strong couplings where the even mode velocity is higher than the odd mode velocity, by incorporating capacitors at the edges of the transmission lines, which capacitors are located between the transmission lines and the ground. In the technique the capacitors are shorted to the ground by using a via connection. A problem with this technique is, however, that it makes the structure more complicated to manufacture, as the used capacitors are connected to the ground, which requires via holes to be made. The technique is well suited to broadside couplers, where the coupling takes place in relation to the broad side of the transmission lines, but not to edged couplers, where the transmission lines are coupled in relation to the narrow side of the transmission lines.

BRIEF DESCRIPTIONS OF THE INVENTION

The present invention seeks to provide an improved high frequency component of layered structure and an improved method for manufacturing a high frequency component of layered structure.

As an aspect of the invention a high frequency component of layered structure is provided, comprising: at least one dielectric layer parallel to the layers of the layered structure, at least two transmission lines for transmitting electrical signals, at least one capacitor, each of which is formed by overlapping parts of two transmission lines, the overlapping parts being for forming capacitive interaction between the parts, and the overlapping parts being arranged to overlap each other in a transversal direction to a dielectric layer parallel to the layers of the layered structure, the dielectric layer being in between the overlapping parts.

As an aspect of the invention a high frequency component of layered structure is provided, comprising: at least two transmission lines for transmitting electrical signals, at least one dielectric layer parallel to the layers of the layered structure, for providing a supporting structure for the transmission lines, two capacitors, each of which is formed by overlapping parts of two transmission lines, the overlapping parts being for forming capacitive interaction between the parts, and the overlapping parts being arranged to overlap each other in a transversal direction to a dielectric layer parallel to the layers of the layered structure, the dielectric layer being in between the overlapping parts.

As an aspect of the invention a method is provided for manufacturing a high frequency component of layered structure, the method comprising: forming at least one capacitor, each of which is formed by overlapping parts of two transmission lines, the overlapping parts being for forming capacitive interaction between the parts, by arranging the overlapping parts to overlap each other in a transversal direction to a dielectric layer parallel to the layers of the layered structure, and arranging the dielectric layer in between the overlapping parts.

As an aspect of the invention a method is provided for manufacturing a high frequency component of layered structure, the method comprising: forming two capacitors, each of which is formed by overlapping parts of two transmission lines, the overlapping parts being for forming interaction between the parts, by arranging the overlapping parts to overlap each other in a transversal direction to the dielectric layer, and arranging a dielectric layer parallel to the layers of the layered structure in between the overlapping parts.

Preferred embodiments of the invention are described in the dependent claims.

The method and the high frequency component of the invention provide several advantages. An advantage of the invention is the increased reliability and thus the increased quality of the high frequency component, since additional components need not be used. This also makes it possible to simplify the manufacturing process. Another advantage is that the manufacturing costs can be reduced by manufacturing a high frequency component using a capacitor formed by overlapping parts of the transmission lines and a dielectric layer in between, instead of using additional components.

Another advantage of the solution of using overlapping parts of transmission lines is that a wider range of capacitance values can be obtained, even with materials with lower dielectric permittivity.

An advantage of an embodiment of the invention is that a higher directivity can be reached without using discrete components to compensate the different propagation mode velocities, the odd mode velocity typically being higher than the even mode velocity, by using for the compensation an even number of capacitors formed with overlapping parts of transmission lines. The compensation enables obtaining increased directivity and decreased amount of reflections, i.e. a better return loss. In an embodiment of the invention it is possible to achieve compensation of propagation velocities even for stronger couplings, which are not achievable using a conventional microstrip design on the top layer of the substrate.

Another advantage of the solution is that as the capacitors are not grounded, no extra holes for grounding vias of the capacitors need be done, which makes the manufacturing of the component easier.

Another advantage of an embodiment of the invention is that, due to printing techniques of printed boards, better coupling levels can be achieved as the coupled lines can be placed closer to each other when the lines are in different layers, compared to the situation when they are on top of the same layer.

LIST OF THE DRAWINGS

In the following, the invention will be described in greater detail with reference to the preferred embodiments and the accompanying drawings, in which FIG. 1 illustrates an example of a high frequency component of layered structure;

DESCRIPTION OF EMBODIMENTS

The embodiments of the invention can be applied in high frequency components used for example in different elements of a radio system, such as base stations, or in different entities of the elements, such as a receiver in the base station. The presented solution can be applied for example as a proximity directional coupler, or a power divider, or some other high frequency component where capacitors may be used, but the invention is however, not, restricted thereto.

Figure 1:
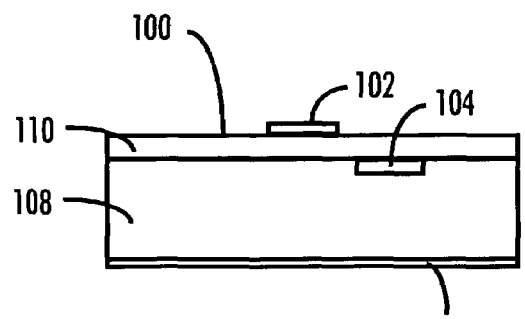

With reference to FIG. 1, an example of a high frequency component 100 of layered structure is explained. FIG. 1 illustrates a cross section of the high frequency component 100 of layered structure which, in our example comprises two dielectric layers 108, 110, which in this case are two dielectric substrates with different dielectric constants $\in_1$, $\in_2$. The high frequency component comprises at least one dielectric layer, but typically the number of dielectric layers is two or more. The high frequency component 100 also comprises a conductive medium, where the high frequency signals propagate, i.e. transmission lines 102, 104 for transmitting electric signals. In the example of FIG. 1 the transmission lines 102, 104 are in different dielectric layers 108, 110. The high frequency component 100 can also comprise a groundplane 106. The number of transmission lines 102, 104 is typically two, but it could also be greater than that. The high frequency component 100 typically also comprises metal layers, for example in FIG. 1 there are three metal layers, the groundplane 106 and a metal layer on top of each dielectric layer 108, 110. For the sake of clarity, all these are, however, not illustrated in FIG. 1. The first transmission line 102 can be on top of the first dielectric substrate, i.e. on the first dielectric layer 110. The second transmission line 104 can be in the second dielectric substrate, i.e. embedded in the second dielectric layer 108, either partly, as in the example of FIG. 1, or totally. The second transmission line 104 may also be on top of the second dielectric substrate, i.e. on top of the second dielectric layer 108. The dielectric layers 110, 108 are parallel to the layers of the layered structure of the high frequency component 100. In other words, the layered structure of the high frequency component 100 is formed by the different layers of the component, such as the dielectric layers 108, 110, the metal layers, and the groundplane 106.

Figure 2:
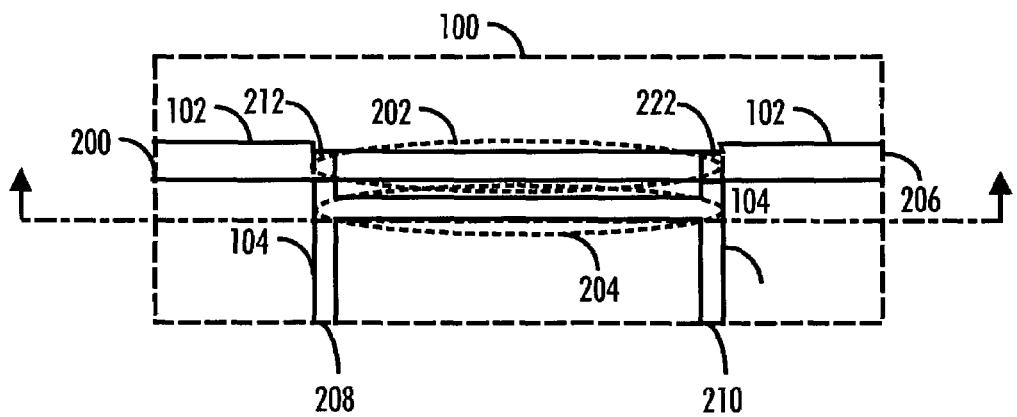
FIG. 2 illustrates an example of a high frequency component of layered structure with capacitors.

Referring to FIG. 2, a schematic view of the high frequency component of layered structure with a capacitor is explained. In the example of FIG. 2, there are two capacitors, but the number of capacitors may also be different, i.e. there may be only one capacitor or more than two capacitors. In the high frequency component 100 of the example, parts of the transmission lines 102, 104 are coupled together during the usage of the component. These parts are coupled lines 202, 204. The transmission lines 102, 104 are in an inhomogeneous dielectric medium: air with a dielectric constant $\in_0$, the first dielectric layer 110 with a dielectric constant $\in_1$ and the second dielectric layer 108 with a dielectric constant $\in_2$. In the example, the first transmission line 102, whose width is $w_{m1}$ is on top the first dielectric layer 110, and comprises a first coupled line 202, whose width is $w_{c1}$ and thickness $t_1$. The second transmission line 104, whose width is $w_{m2}$, is on the second dielectric layer 108 and comprises a second coupled line 204, whose width is $w_{c2}$ and thickness $t_2$. The width of the transmission lines 102, 104 in the coupled area, i.e. the width $w_{c1}$, $w_{c2}$ of the coupled lines 202, 204, may be different than the width $w_{m1}$, $w_{m2}$, of the transmission lines 102, 104 in the area where they are not coupled. $S_m$ is the distance between the coupled lines 202, 204, i.e. the proximity of the coupled lines 102, 104. The high frequency component 100 of the example comprises an input port 200 and an output port 206 connected to the ends of the first transmission line 102. The high frequency component 100 also comprises two other ports in the ends of the second transmission line 104.

Short sections of the two transmission lines 102, 104 are arranged to overlap each other for forming capacitive interaction between the parts, i.e. a short section of the second transmission line 104 is arranged to go under a short part of the first transmission line 102. In this application, these shortsections of the transmission lines are called the overlapping parts of the transmission lines, the overlapping parts being for forming capacitive interaction between the parts. In the example of FIG. 2, the overlapping parts 212, 222 of the first transmission line 102 overlap the overlapping parts of the second transmission line 104, which in the example, are short stub ends in the lower transmission line 104. The overlapping parts of the transmission lines can be of different width than the rest of the transmission line, i.e. they can be formed by modifying the measures of a transmission line at a certain short length of the transmission line by making the transmission line wider in the area of the overlapping part, for example. An overlapping part can be in a stub diverging from a transmission line. The overlapping parts of the transmission lines can be in a crossing of two transmission lines The high frequency component 100 of the example can be a proximity directional coupler (DCPL). Directional couplers, which are used to divide or combine transferred power, typically comprise four ports, typically called the input port 200, the output port 206, the coupled port 208 and the isolated port 210. In an ideal directional coupler, the incoming power entering the input port 200 of the directional coupler is divided to the output port 206 and to the coupled port 208 of the component, whereas no power enters the isolated port 210. Directional couplers can typically be used for sampling based on a known coupling value, either an incident wave (forward wave) or a reflected wave (backward wave) in a transmission line. In particular cases directional couplers can be used as power dividers. Directional couplers can typically be applied, for example, to monitoring of the output power of RF or microwave transmitters, injection of the additional signals to the main receiver channel, distribution of the signals to the antenna arrays, to feed-forward amplifiers, or to RF or microwave reflectometry.

A directional coupler can be implemented using coupled lines 202, 204 in which case it can be called the proximity directional coupler. The coupled lines 202, 204 are typically implemented using microstrips 102, 104. In such a case, the directional coupler can be called a microstrip directional coupler or a microstrip coupler. In the high frequency component 100 using coupled lines 202, 204, the transmission lines 102, 104 are coupled together during the usage of the component, typically at a length equal to a quarter of the wavelength corresponding to the center frequency of the applicable frequency range of the component, i.e. the directional coupler in this case.

The coupling value C' of a directional coupler using coupled lines is in relation to the distance between the coupled lines $S_m$ and to the widths of the coupled lines $w_{c1}$, $w_{c2}$. When designing a proximity directional coupler, whose ports are terminated with impedance $Z_0$ the classical equations (1) and (2) for the even and the odd mode impedances $Z_{0e}$, $Z_{0o}$ as a function of the desired coupling coefficient C' can be used:

$$Z_{oe} = Z_o \sqrt{\frac{1+C'}{1-C'}} \quad (1)$$

$$Z_{oo} = Z_o \sqrt{\frac{1-C'}{1+C'}} \quad (2)$$

where
C' is the coupling coefficient,
$Z_o$ is the characteristic impedance of the transmission lines in an uncoupled area,
$Z_{oe}$ is the even-mode characteristic impedance, and
$Z_{oo}$ is the odd-mode characteristic impedance.

Adequate signal coupling can usually be achieved with directional couplers using microstrips, but they typically cannot ensure acceptable directivity due to the inhomogenous dielectric medium. When the coupled lines, e.g. the microstrips, are on top of a common substrate, a part of the electric field is in the substrate and a part in the air. In the even mode, the proportion of the field in the air is different than in the odd mode. Therefore the phase velocities $v_p$ of the even and the odd propagation mode and thus also the effective dielectric constants e are not equal. In a typical printed board application, especially with low values of dielectric constants ∈, directivity is of the order of 10 dB at the center frequency. At higher frequencies the directivity decreases and can totally disappear leading to a situation where the signal in the isolated port is higher than in the coupled port. When a multilayered printed board is used, the directivity and also the coupling level of a microstrip directional coupler can be increased to some extent by placing the microstrips on two adjacent layers, e.g. one of the coupled lines is placed on the top layer and another on the next layer. However, the inhomogeneity of the dielectric medium causes differences in propagation mode velocities, which in turn degrades the directivity.

Figure 3A:
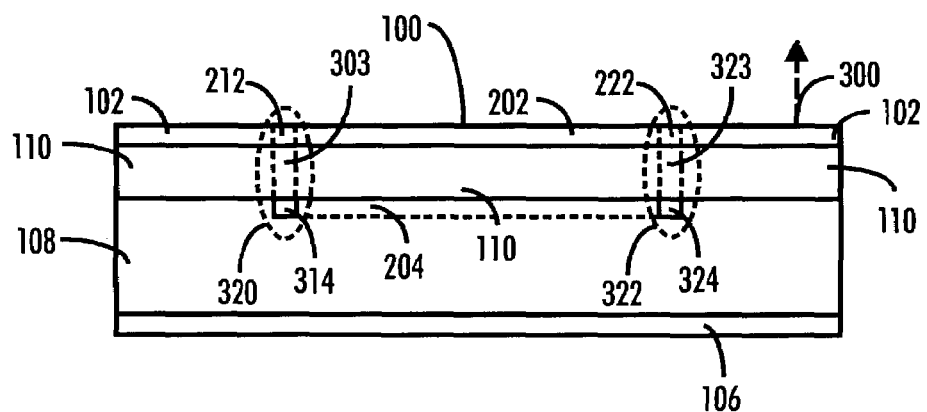
FIG. 3a is a cross section of a high frequency component of layered structure with capacitors.

Referring to FIG. 3a a cross section of the high frequency component 100 of layered structure with a capacitor is further described. By using a capacitor, the directivity of the high frequency component 100 can be improved. In the embodiment of FIG. 3a, similarly to the example of FIG. 2, a further advantage is gained by using two capacitors, which makes it also possible to compensate unequal even- and odd-mode velocities as well as reflections resulting from discontinuities caused by the inserted capacitors. The high frequency component 100, which could, for example, be a microstrip coupler, or a proximity directional coupler, comprises at least two transmission lines 102, 104 that are coupled together, i.e. they comprise coupled lines 202, 204. The overlapping parts 212, 314, 222, 324 of the transmission lines 102, 104 are arranged to overlap each other in a direction transversal to the dielectric layer in such a manner that a dielectric layer 110 is in between the overlapping parts 212, 314 and the overlapping parts 222, 324 of the transmission lines 102, 104. The overlapping parts 212, 314 and the dielectric layer 110 form a capacitor 320, and the overlapping parts 222, 324 and the dielectric layer 110 form a capacitor 322 respectively. The capacitance of the capacitor 320, 322 depends on the overlapping area of the overlapping parts 212, 314, 222, 324, the thickness $H_1$ of the dielectric layer 110 between the overlapping parts 212, 314 and the overlapping parts 222, 324, and the dielectric constant $\in_1$ of the first dielectric layer 110 on the top. In the embodiment of FIG. 3a, the first dielectric layer 110 can have a different dielectric constant $\in_1$ than the second dielectric layer 108 with a dielectric constant $\in_2$, i.e. the dielectric layers can be two different dielectric substrates. Typically, the overlapping parts 314, 324 in the transmission line 104 which are closer to the groundplane 106 are surrounded by the dielectric layers 110, 108 in all possible directions, whereas the overlapping parts 212, 222 in the transmission line 102 which are further from the groundplane 106 are typically on top of the dielectric layer 110. However, the overlapping parts 212, 222 in the transmission line 102 may also be embedded in the dielectric layer 110, either totally or partly.

Figure 3B:
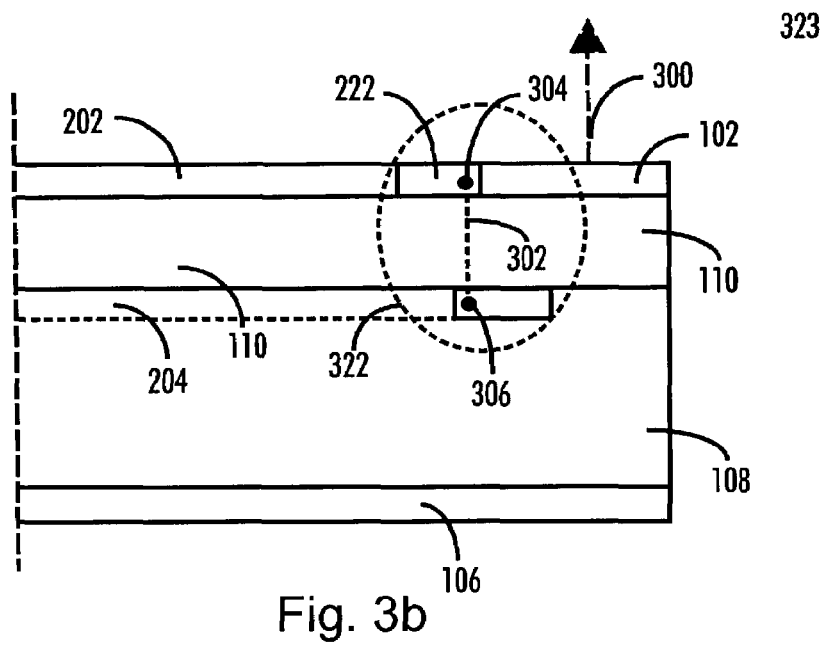
FIG. 3b illustrates another cross section of a high frequency component of layered structure with a capacitor.

FIG. 3b illustrates another example of a cross section of the high frequency component 100 of layered structure with a capacitor 322 formed by arranging the overlapping parts of the transmission lines 102, 104 (see FIG. 2), more specifically the overlapping parts of the coupled sections of the transmission lines 102, 104, i.e. the overlapping parts of the coupled lines 202, 204 to overlap each other in a transversal direction to the dielectric layer 110. With reference to FIG. 3b, the structure of the capacitor 322 is further explained. Generally, relating to the capacitor 322 formed by two overlapping parts 222, 324 of the transmission lines, it is possible to draw a line 302, which is parallel to the normal 300 of the dielectric layer 110, via the points 304, 306 of at least one pair of points 304, 306, one point 304 of each pair belonging to one overlapping part 222 and the other point 306 of each pair belonging to another overlapping part 324. FIG. 3b illustrates a situation where the overlapping parts 222, 324 are only partly on top of each other, whereas in the embodiment of FIG. 3a the overlapping parts 222, 324 and the overlapping parts 212, 314 are completely on top of each other. However, in both cases it is possible to draw a line 302 parallel to the normal 300 of the dielectric layer 110. Thus, the transversal direction to the dielectric layer 110 is typically parallel to the normal 300 of the dielectric layer 110.

Figure 4:
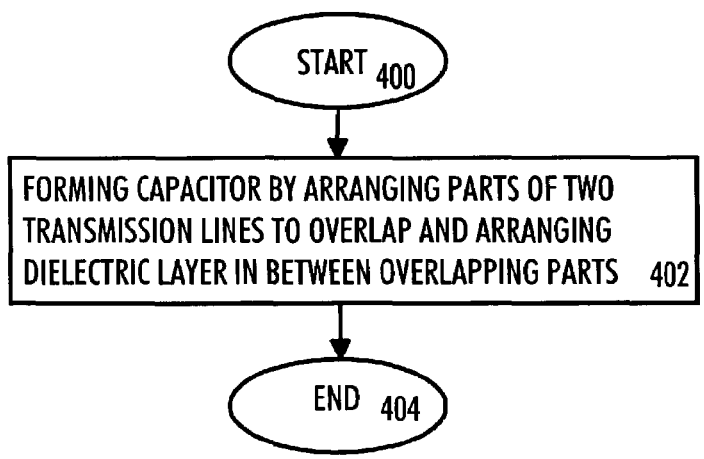
FIG. 4 is a flow chart illustrating a method for manufacturing a high frequency component of layered structure.

Referring now to the flow chart of FIG. 4, a method for manufacturing a high frequency component of layered structure is described. The method starts in 400. In 402, at least one capacitor is formed. Each capacitor is formed by arranging overlapping parts of two transmission lines, the overlapping parts being for forming capacitive interaction between the parts, to overlap each other in a transversal direction to a dielectric layer parallel to the layers of the layered structure, and arranging the dielectric layer in between the overlapping parts of the transmission lines. The method ends in 404.

In an embodiment, the transmission lines are coupled lines, for example coupled microstrip lines. They can typically be coupled together at a length equal to a quarter of the wavelength of the transmitted signal. The coupled lines can be applied to form a proximity directional coupler.

In an embodiment the manufactured high frequency component comprises a proximity structure, wherein the transmission lines are parallel and in a certain proximity to each other in the direction of the dielectric layer. Typically the proximity structure is located next to the capacitor, wherein the transmission lines near the capacitor are parallel and at a certain distance from each other at a certain length of the transmission lines. For example, in the example of FIG. 2 the coupled lines 202, 204 form such a proximity structure. Typically, there is a proximity structure between two capacitors, like between a capacitor 303 and a capacitor 323 in FIG. 3a. The proximity structure enables the transmission lines to be close to each other, which has an improving effect on the performance of the high frequency component.

In an embodiment, the manufactured high frequency component comprises four ports, of which ports one is an isolated port. In an embodiment a proximity directional coupler is manufactured.

In the embodiments of FIG. 2, FIG. 3a and FIG. 3b, there are two capacitors, which are located in the ends of the coupled lines 202, 204, i.e. at the end points of the parallel sections of the transmission lines 102, 104. This makes it possible to compensate differences of the unequal even- and odd-mode velocities. Alternatively, in other embodiments, the capacitors may as well be located in other positions along the coupled lines 202, 204.

In an embodiment, the coupled transmission lines 102 and 104 are in different layers of a common dielectric layer 110 of a common dielectric substrate. Thus the overlapping parts 212, 314 and the overlapping parts 222, 324 can be separated by a dielectric layer 303, 323 formed by a layer in the common dielectric layer 110 of a common dielectric substrate.

In an embodiment, the overlapping parts 212, 222 are on top of a dielectric layer 110 and the overlapping parts 222, 324 are inside the same dielectric layer 110 surrounded by the dielectric layer 110 in all possible directions. Thus, the overlapping parts 212, 314 and the overlapping parts 222, 324 can be separated by a dielectric layer 303, 323 formed by a layer in the common dielectric layer 110 of a common dielectric substrate.

In an embodiment, the transmission lines 102, 104 are on the same layer of the same dielectric layer 110 of a common dielectric substrate, i.e. the transmission lines 102, 104 are on top of the same dielectric layer 110 and parallel between the capacitors, and only the overlapping parts 212, 314 and the overlapping parts 222, 324 of the transmission lines 102, 104 are separated by a dielectric layer 303, 323 formed by one layer in the dielectric layer 110 of a common dielectric substrate.

In an embodiment, the high frequency component can comprise an even number of capacitors, each of which is formed by overlapping parts of two transmission lines, the overlapping parts being arranged to overlap each other in a transversal direction to a dielectric layer parallel to the layers of the layered structure, the dielectric layer being in between the overlapping parts. This enables compensating the unequal even- and odd-mode velocities. The multiple capacitors may also be formed by such a manner that the transmission lines are arranged to cross each other and a capacitor is formed at the crossing.

Figure 5:
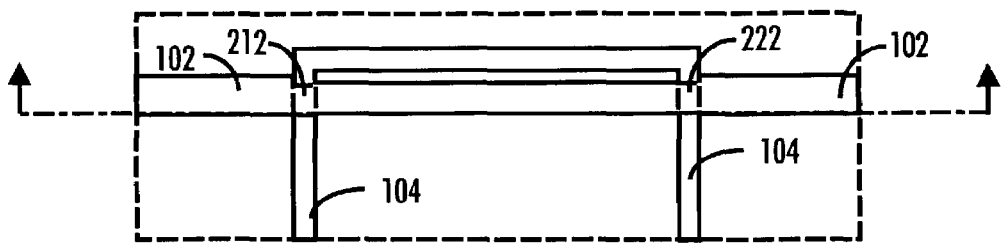
FIG. 5 illustrates another example of a high frequency component of layered structure with capacitors.

With reference to FIG. 5 and FIG. 3a, another embodiment is described. In the example, the transmission lines 102, 104 are arranged to cross each other. Each capacitor 320, 322 is thus formed by overlapping parts of two transmission lines 102, 104, which transmission lines 102, 104 are arranged to cross each other, and by a dielectric layer 110 (described in FIG. 3a) that is arranged in between the overlapping parts 212, 222 of the first transmission line 102 and the overlapping parts 314, 324 (see FIG. 3a) of the second transmission line 104. In this case, the overlapping parts 212, 222, 314, 324 are parts of the transmission lines 102, 104 in the crossing area of the transmission lines 102, 104. The two transmission lines are arranged to cross each other in a transversal direction to a dielectric layer parallel to the layers of the layered structure.

Figure 6:
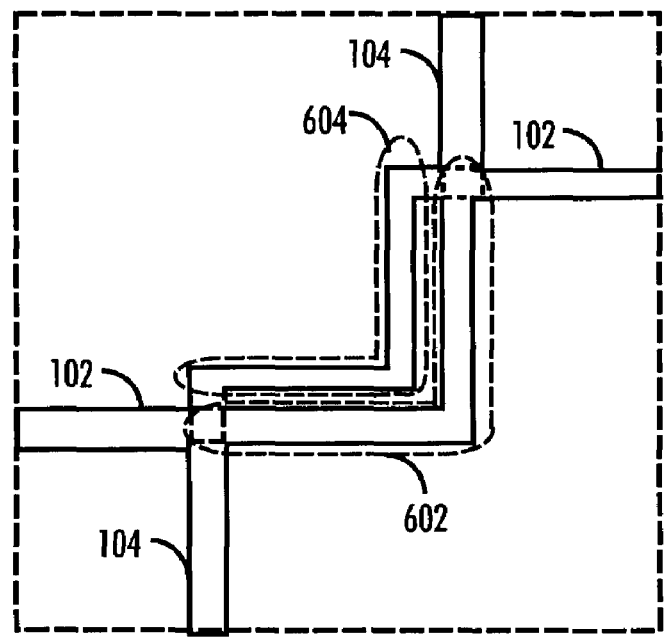
FIG. 6 illustrates a third example of a high frequency component of layered structure with capacitors.

FIG. 6 shows an embodiment where the transmission lines 102, 104 are bent. The coupled lines 602, 604 have different electrical lengths, due to the different dielectric environment. Bending of the transmission lines 102, 104 enables decreasing the physical length of the lower transmission line 104, thus making it possible to equalize the electrical lengths of both coupled lines 602, 604.

Figure 7:
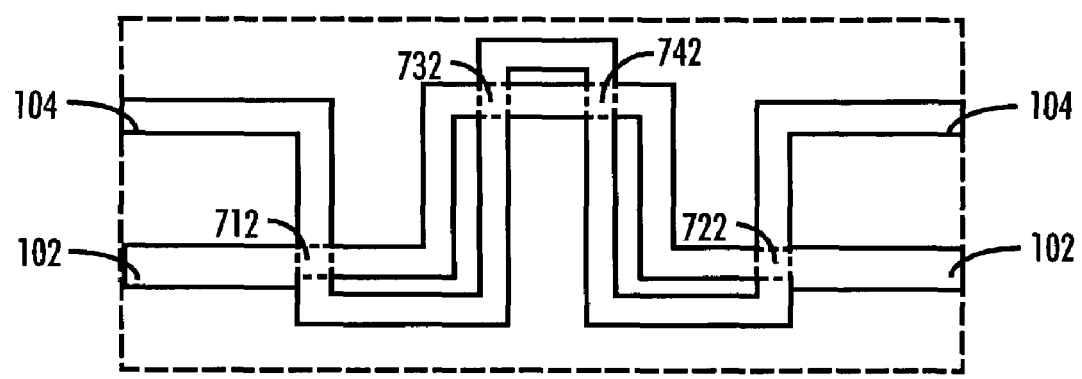
FIG. 7 shows a fourth example of a high frequency component of layered structure with multiple capacitors.

In an embodiment the high frequency component comprises multiple capacitors. Each capacitor is formed by arranging the overlapping parts of two transmission lines to overlap each other in a transversal direction to the dielectric layer, and by arranging a dielectric layer in between the overlapping parts. The capacitors may also be formed at a crossing of two transmission lines by overlapping parts of transmission lines which are arranged to cross each other. The number of formed capacitors may either be an even number or an odd number. This kind of a solution with multiple capacitors can be applied, for example, in shaping the frequency characteristics of a coupler according to the requirements set by particular applications. In the case of a multilayer substrate, especially if different dielectric substrates are used, the proper location of capacitors has to be determined case by case in order to achieve a required shape of the coupler frequency characteristics. FIG. 7 illustrates such an embodiment with multiple capacitors, in which case there can be an even number of capacitors, e.g. four capacitors 712, 722, 732, 742 like in the example of FIG. 7. FIG. 7 also illustrates an embodiment where the transmission lines 102 104 are meandering. This kind of a meandering structure is compact and helps to save the printed board area.

Figure 8:
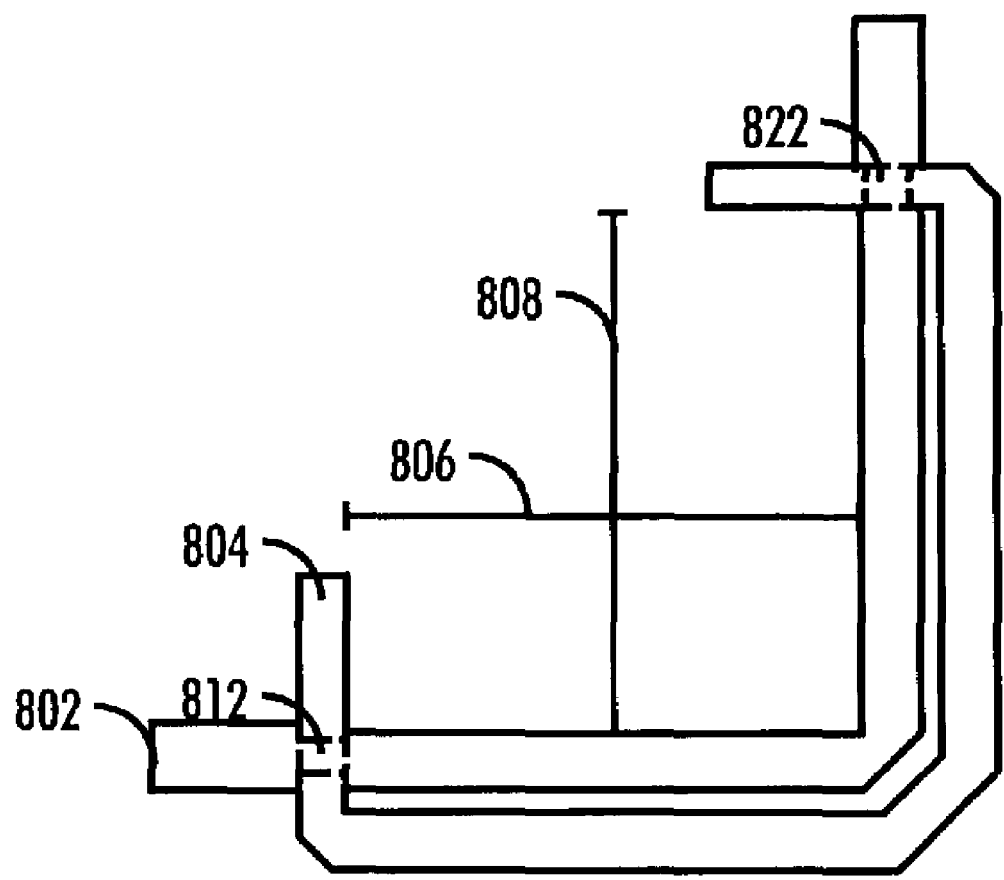
FIG. 8 illustrates an example of designing a microstrip proximity directional coupler with capacitors.

Referring to FIG. 8 and FIG. 1, a practical example of designing a microstrip directional coupler 800 with a capacitor is explained. In the case of our example, a commercially available proximity directional coupler introduces too high reflection (return loss, RL≈16 dB), which is unacceptable from the total reflection budget point of view. The proximity directional coupler according to the prior art also has too low directivity (D≦10 dB). In the example an analysis shows that the return loss RL of the directional coupler should be of the order of 30 dB and the directivity D≧15 dB, which the commercially available directional couplers cannot guarantee. The coupling (C') is not critical, but should not be too strong due to preservation of the signal power in the main signal line. For the same reason, the directivity (D) shall be maximized. Thus, the required specification for the directional coupler of the example is as follows:

RL≧30 dB
IL≦0.4 dB
C=13 dB–15 dB
D≧15 dB
Zo=50 Ω

In the example, the input data for the directional coupler design results from the assumed build-up of a printed board. The preliminary values for the design are obtained using following formulas (1b) and (2b) based on the earlier mentioned classical equations (1) and (2) for the even- and odd-mode impedances as a function of the desired coupling C [dB]:

$$Z_{oe} = Z_o \sqrt{\frac{1 + 10^{\frac{-C[dB]}{20}}}{1 - 10^{\frac{-C[dB]}{20}}}} \quad (1b)$$

$$Z_{oo} = Z_o \sqrt{\frac{1 - 10^{\frac{-C[dB]}{20}}}{1 + 10^{\frac{-C[dB]}{20}}}} \quad (2b)$$

where
C is coupling:

$$C[dB] = 20\log\frac{1}{|S_{41}|}$$

(i=1—input port, j=4—coupled port),
Sji are the parameters of the scattering matrix (i,j—port numbers),
$Z_o$ is the characteristic impedance (e.g. 50 Ω),
RL is the return loss:

$$RL[dB] = 20\log\frac{1}{|\Gamma|} = 20\log\frac{1}{|S_{11}|},$$

D is the directivity:

$$D[dB] = IL[dB] - C[dB] = 20\log\frac{|S_{41}|}{|S_{31}|},$$

(j=3—isolated port),
IL is the insertion loss:

$$IL[dB] = 20\log\frac{1}{|S_{21}|}$$

(i=1—input port, j=2—output port),
VSWR is the voltage standing wave ratio:

$$VSWR = \frac{1 + |\Gamma|}{1 - |\Gamma|},$$

$S_m$ is the distance between the coupled lines,
$Z_{oe}$ is the even-mode characteristic impedance, and
$Z_{oo}$ is the odd-mode characteristic impedance.

Let us assume, that $Z_o$=50 Ω and C=14 dB. Using formulas (1b) and (2b) we obtain the following values: $Z_{oe}$=61.21 Ω and $Z_{oo}$=40.84 Ω.

The main dimensions of the directional coupler for the assumed printed board chosen to be used as a starting point in the simulations of the assumed shape of the directional coupler are as follows (see FIG. 1 and FIG. 8):

$w_{m1}$=0.70 mm is the width of the microstrip line 802 on the first dielectric layer 110 in the uncoupled area,
$w_{m2}$=0.50 mm is the width of the microstrip line 804 on the second dielectric layer 108 in the uncoupled area, and
$S_m$=0.18 mm is the distance between the coupled lines 802, 804.

The layout of the 14 dB directional coupler 800 of the practical example, obtained with the simulations, is described in FIG. 8. In this instance, as a result of the simulations, e.g. the following dimensions for the directional coupler 800 can be obtained: the width of the first microstrip line is $w_{m1}$=0.72 mm, with the width $w_{cr}$=0.35 mm in crossover areas 812, 822, and the width of the second microstrip line is $w_{m2}$=0.53 mm, the distance 806 from the first crossover 812 to the corner of the microstrip line 804 is $l_1$=7.00 mm, the length 808 from the corner of the microstrip line 804 to the second cross-over 822 is $l_2$=7.00 mm, the width of the microstrip line 804 in the coupled area $w_{c1}$=0.67 mm and the width of the microstrip line 802 in the coupled area $w_{c2}$=0.45 mm. The input data for the directional coupler design results from the assumed build-up of the printed board and can vary. Thus, also the simulating and design results vary case by case, which is obvious to a person skilled in the art.

As can be seen from FIG. 8, in the example the microstrip line 802 on the first dielectric layer 110 (see FIG. 1) crosses over the embedded microstrip line 804 at the beginning and at the end of the coupling region in order to improve both the matching and the directivity of the coupler. The crossovers 812, 822 act as lumped plate capacitors that can compensate the differences between the even- and odd-mode propagation velocities. In the case of the example, the results of the simulations and the performed measurements indicate that all the parameters fulfil the specification requirements used in the example (C'=14 dB, D=16 dB and RL=35 dB in the frequency range of interest around 2 GHz).

Even though the invention is described above with reference to examples in accordance with the accompanying drawings, it is clear that the invention is not restricted thereto but it can be modified in several ways within the scope of the appended claims.

I claim:

1. A high frequency component of layered structure, comprising:
   at least one dielectric layer parallel to the layers of the layered structure,
   at least two transmission lines for transmitting electrical signals,
   at least one capacitor, each of which is formed by overlapping parts of two transmission lines,
   the overlapping parts being for forming capacitive interaction between the parts, and the overlapping parts being arranged to overlap each other in a transversal direction to a dielectric layer parallel to the layers of the layered structure,
   the dielectric layer being in between the overlapping parts, wherein at least one capacitor is at the end of the coupled section of the transmission line.

2. A method for manufacturing a high frequency component of layered structure, the method comprising:
   forming at least one capacitor, each of which is formed by overlapping parts of two transmission lines, the overlapping parts being for forming capacitive interaction between the parts,
   by arranging the overlapping parts to overlap each other in a transversal direction to a dielectric layer parallel to the layers of the layered structure, and arranging the dielectric layer in between the overlapping parts, the method further comprising forming at least one capacitor at the end of the coupled section of the transmission line.

* * * * *